(12) United States Patent
Cox et al.

(10) Patent No.: US 6,411,253 B1
(45) Date of Patent: Jun. 25, 2002

(54) EQUALIZATION SYSTEM USING GENERAL PURPOSE FILTER ARCHITECTURE

(75) Inventors: Lloyd C. Cox, Tucson; Gary A. Gramlich, Oro Valley, both of AZ (US); Robert M. Baker, Simi Valley, CA (US); Stephen Freeman, Tucson, AZ (US); Brian P. Neary, Marcellus, NY (US); Cynthia R. Krzemien, Tucson, AZ (US); Jordan A. Krim, Longmont, CO (US); Luis R. Nunez, Tucson, AZ (US)

(73) Assignee: Raytheon Company, Lexington, MA (US)

( * ) Notice: Subject to any disclaimer, the term of this patent is extended or adjusted under 35 U.S.C. 154(b) by 20 days.

(21) Appl. No.: 09/593,202

(22) Filed: Jun. 14, 2000

(51) Int. Cl.[7] .................................................. H04N 5/21
(52) U.S. Cl. .......................................... 342/194; 342/13
(58) Field of Search ................................. 342/195, 194, 342/13; 348/607

(56) References Cited

U.S. PATENT DOCUMENTS 5,528,311 A * 6/1996 Lee et al. .................. 348/607

* cited by examiner

Primary Examiner—Daniel T. Pihulic
(74) Attorney, Agent, or Firm—William J. Benman; Colin M. Raufer; Glenn H. Lenzen, Jr.

(57) ABSTRACT

An equalization system and method. In a most general sense, the inventive equalization system includes first and second filters for filtering an in-phase component of a received signal in accordance with first and second sets of coefficients, respectively. The system includes third and fourth filters for filtering a quadrature component of the input signal in accordance with third and fourth sets of coefficients, respectively. The outputs of the first and third filters are subtracted to provide an equalized in-phase output signal and the outputs of the second and fourth filters are added to provide an equalized quadrature output signal. In the illustrative embodiment the filters are finite impulse response filters and the coefficients are provided by a microprocessor. In accordance with the present teachings, the filters are implemented in a general purpose filter. The delay elements of the filters are calculated in accordance with a mean square error algorithm. Accordingly, the coefficients are the product of the correlation between inputs to the delay elements and a cross correlation between the inputs and a set of values representative of a desired response.

14 Claims, 11 Drawing Sheets

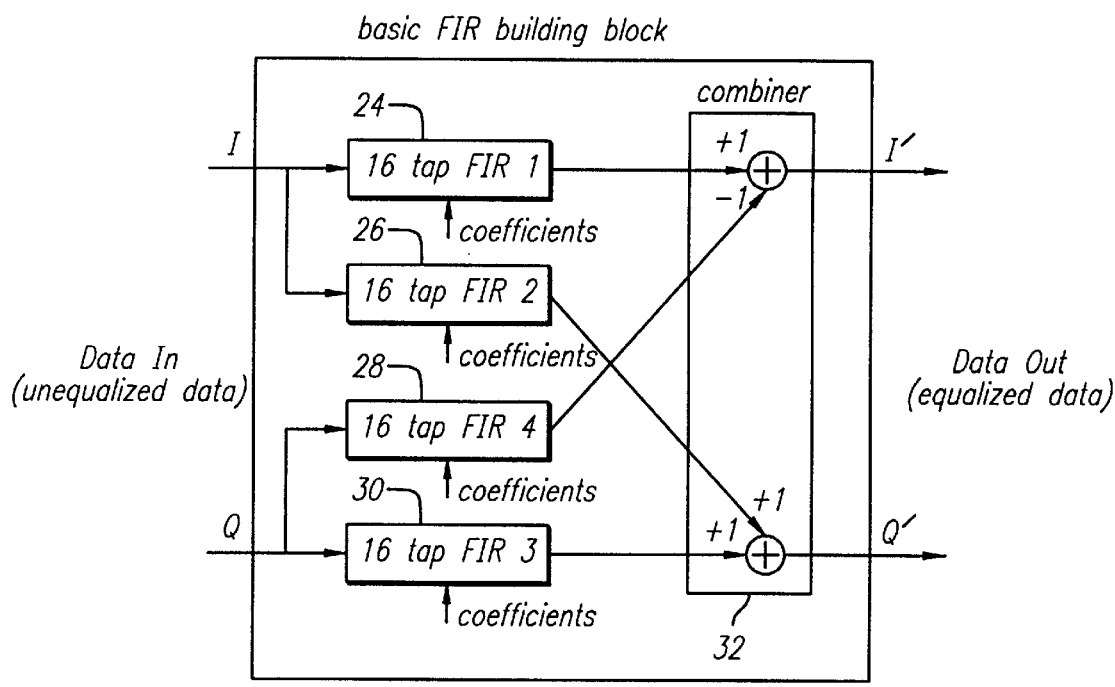
FIG. 11
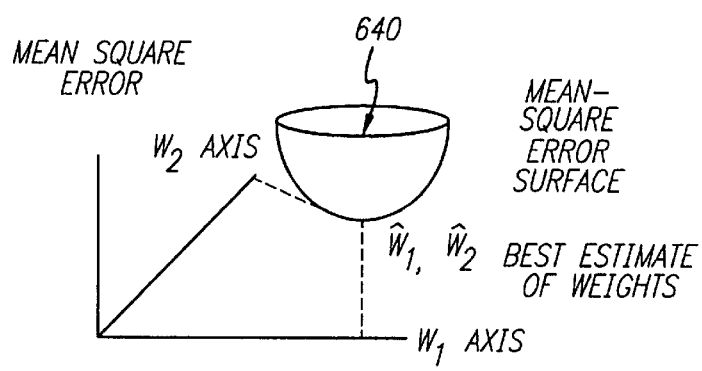
FIG. 13
FIG. 14

EQUALIZATION SYSTEM USING GENERAL PURPOSE FILTER ARCHITECTURE

A portion of the disclosure of this Patent document contains material which is subject to copyright protection. The copyright owner has no objection to a facsimile reproduction, by any one, of the patent document or the patent disclosure, as it appears in the Patent and Trademark Office patent files or records, but otherwise reserves all copyrights with respect thereto.

BACKGROUND OF THE INVENTION

1. Field of the Invention

The present invention relates to radar receivers. More specifically, the present invention relates to equalization systems used in high performance digital radar receivers.

2. Description of the Related Art

Sophisticated high performance military and commercial digital radar receivers detect and process signals in complicated environments that include broadband clutter, interference sources (intentional and unintentional), echoes, and receiver noise. These receivers perform some or all of the following functions: synthesis of in-phase (I) and quadrature (Q) components from high-speed sampled signals, formation of video filters, notch DC components, decimation of data, provision of channel-to-channel equalization, digital range correlation, beam steering and interference cancellation.

Currently, these tasks are performed by Hilbert filters, digital video filters, equalization filters, discrete Fourier transform filters, decimating filters, convolvers, correlators, and general purpose cascadable finite impulse response (FIR) filters implemented in commercial off-the-shelf hardware (COTS) and customized hardware in embedded systems.

Unfortunately, digital radar receivers implemented in accordance with conventional teachings often require several hundred signal processing chips. As a result, conventional digital radar receivers are typically heavy, bulky, and expensive to develop and manufacture. In addition, these receivers typically consume considerable power and generate much heat.

Hence, there was a need in the art for a unique receiver architecture that would be highly flexible, scalable, and reconfigurable that could perform the numerous functions mentioned above. The need in the art was addressed by copending application entitled GENERAL PURPOSE FILTER, filed Ser. No. 09/593,203, by L. C. Cox et al. (Atty. Docket No. PD R98027-1), the teachings of which are incorporated by reference. This application disclosed and claimed a signal processor design including a plurality of filters which were selectively interconnected to provide a variety of digital signal processing functions. In the illustrative embodiment, each filter was adapted to multiply input data by a coefficient. Specifically, each filter was adapted to multiply input data by coefficients to form digital filtering products which were combined to accumulate the sum of the products. The coefficients are provided by a microprocessor and configure the logic to a particular function, such as a general purpose filter, a Hilbert filter, a finite impulse response filter, an equalizer, a convolver, a correlator, or an application specific integrated circuit by way of example. When interconnected in accordance with the teachings provided therein, these circuits may be used to provide a digital receiver.

The digital receiver would comprise a plurality of general purpose filters constructed in accordance with the referenced teachings. Each filter would have a plurality of filter banks, switching circuitry to interconnect the filter banks, and programmability provided by an external processor. The processor would configure the filter banks, to provide a delay element, a first decimating filter and a first equalizer in a first channel of a first general purpose filter and a Hilbert transform, a second decimating filter and a second equalizer in a second channel of the first general purpose filter. A first range correlator would be provided in a first channel of a second general purpose filter and a second range correlator would be provided in a second channel of a second general purpose filter. The first channel of the first general purpose filter would be connected to the first channel of the second general purpose filter and the second channel of the first general purpose filter would be connected to the second channel of the second general purpose filter.

An external processor would program the general purpose filter to configure the filter banks to simultaneously provide the functions found in most digital receivers (e.g., Hilbert transforms, video filters, equalizers, range correlation, and general purpose video filters).

The versatile, flexible and reusable features of the general purpose filter architecture allows analog and digital receivers to be built using a single chip type. Accordingly, the receivers would be much smaller and lighter in weight than conventional systems and have lower associated power dissipation, thermal heating, and development and manufacturing cost.

While the teachings of the referenced patent application substantially addressed the need in the art, a need remains for a system and technique for implementing equalization in a digital radar receiver using a general purpose filter architecture.

SUMMARY OF THE INVENTION

The need in the art is addressed by the equalization system and method of the present invention. In a most general sense, the inventive equalization system includes first and second filters for filtering an in-phase component of a received signal in accordance with first and second sets of coefficients, respectively. The system includes third and fourth filters for filtering a quadrature component of the input signal in accordance with third and fourth sets of coefficients, respectively. The outputs of the first and third filters are subtracted to provide an equalized in-phase output signal and the outputs of the second and fourth filters are added to provide an equalized quadrature output signal.

In the illustrative embodiment the filters are finite impulse response filters and the coefficients are provided by a microprocessor. In accordance with the present teachings, the filters are implemented in a general purpose filter. The delay elements of the filters are calculated in accordance with a mean square error algorithm. Accordingly, the coefficients are the product of the correlation between inputs to the delay elements and a cross correlation between the inputs and a set of values representative of a desired response.

In an illustrative application, the system is implemented in a digital receiver having an antenna for receiving a radio frequency signal. A first signal processor is disposed in a first channel for processing the received signal and providing a first baseline signal in response thereto. A second signal processor disposed in a second channel for processing the received signal and providing a second baseline signal in response thereto. The receiver includes first and second analog to digital converters for processing the first and second baseline signals, respectively, and providing first digitized baseline signals in response thereto. A circuit is included for equalizing the first and second baseline signals. The equalizing circuit includes first and second equalizers disposed in the first and second channels respectively. Each of the equalizers comprises first and second filters for filtering an in-phase component of a received signal in accordance with first and second sets of coefficients, respectively. Third and fourth filters are included for filtering a quadrature component of the input signal in accordance with third and fourth sets of coefficients, respectively. A subtractor is included for subtracting the outputs of the first and third filters to provide an equalized in-phase output signal. The outputs of the second and fourth filters are added to provide an equalized quadrature output signal. The equalizing circuit further includes a processor for providing the coefficients. The outputs of the first and second equalizers are combined to provide the output of the receiver.

BRIEF DESCRIPTION OF THE DRAWINGS

FIG. 11 shows an illustrative configuration of a general purpose filter 600 or 602 such as that disclosed herein configured to provide equalization in accordance with the teachings of the present invention.

FIG. 13 shows an illustrative sample set A, a weight set W and a reference set r.

FIG. 14 is a diagram which depicts an illustrative technique utilized to determine the weights for the receiver of the present invention.

DESCRIPTION OF THE INVENTION

Illustrative embodiments and exemplary applications will now be described with reference to the accompanying drawings to disclose the advantageous teachings of the present invention.

While the present invention is described herein with reference to illustrative embodiments for particular applications, it should be understood that the invention is not limited thereto. Those having ordinary skill in the art and access to the teachings provided herein will recognize additional modifications, applications, and embodiments within the scope thereof and additional fields in which the present invention would be of significant utility.

Figure 1:
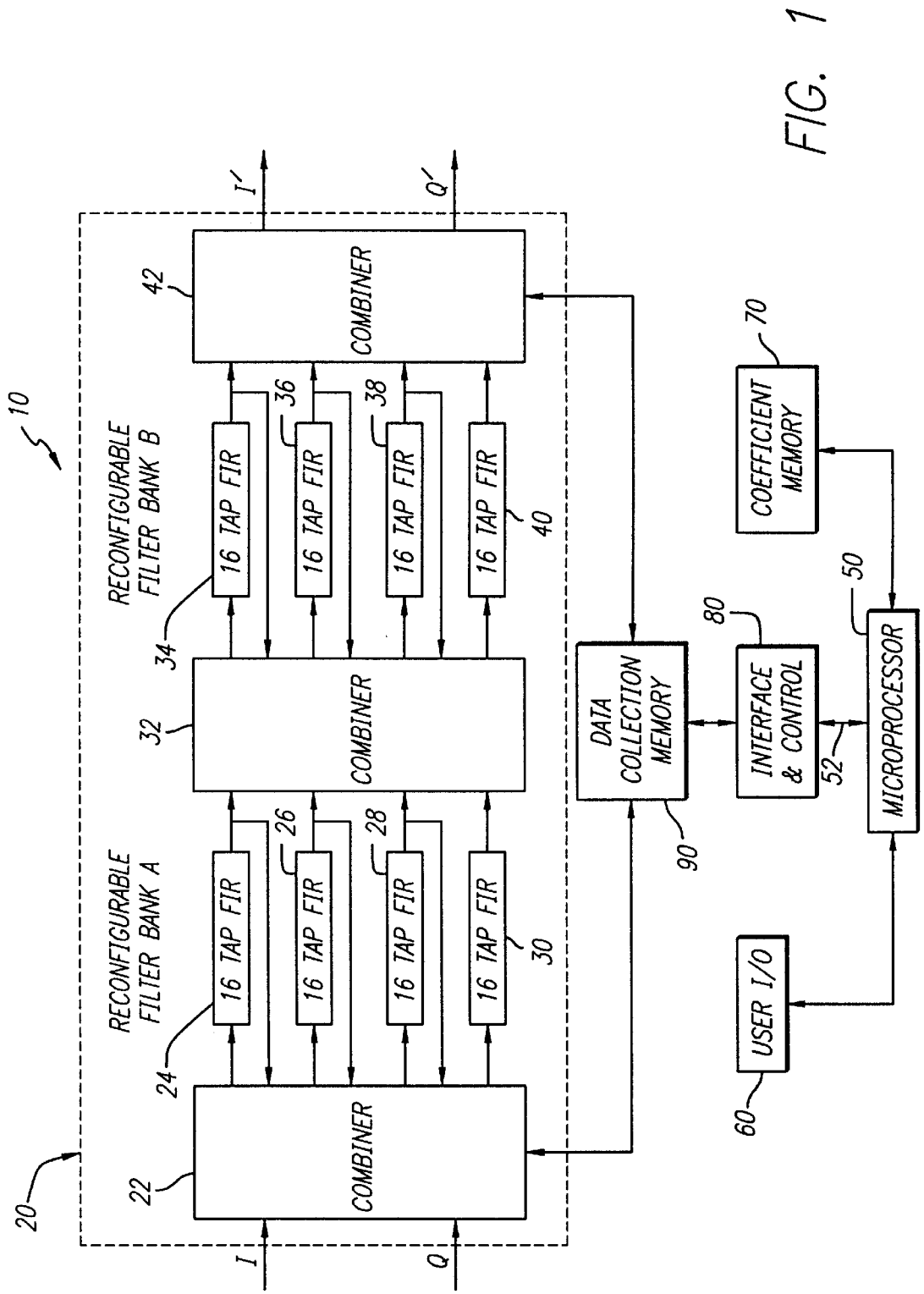
FIG. 1 is a block diagram of the general purpose filter of the present invention along with associated control circuitry.

FIG. 1 is a block diagram of a general purpose filter constructed in accordance with the teachings of the above-referenced and incorporated application filed by Cox et al. along with associated control circuitry. The system 10 consists of the general purpose filter 20, a microprocessor 50, a user interface 60, a coefficient memory 70, an interface and control circuit 80, and a data collection memory 90. The filter 20 includes first, second and third combiners 22, 32 and 42 which allow the microprocessor 50 to selectively interconnect a plurality of 16 tap finite impulse response (FIR) filters 24–30 and 34–40 (even numbers only) therebetween via a bus (not shown). Tap filters 24–30 provide a first filter bank A between the first and second combiners 22 and 32, respectively. Tap filters 34–42 provide a second filter bank B between the second and third combiners 32 and 42, respectively. Note that the outputs of the first three filters in each bank are fed back to the inputs thereof. Those skilled in the art will recognize that the teachings of the present invention are not limited to FIR filter implementations. The present teachings may be implemented with infinite impulse response (IIR) filters as well.

A user selects a function to be implemented via a user interface 60. As discussed more fully below and in accordance with the present teachings, in response to the user input, the microprocessor 50 selectively interconnects the tap filters via the combiners as necessary to implement the desired function. Much of the signal processing required to implement digital radar receivers can be implemented with a plurality of digital filters properly weighted. Accordingly, in the present invention, the filters are interconnected and provided with tap weight coefficients by the microprocessor as necessary for the desired functionality. The coefficients are provided by a coefficient memory 70. In the illustrative embodiment, an interface and control circuit 80 provides timing and control.

Figure 2:
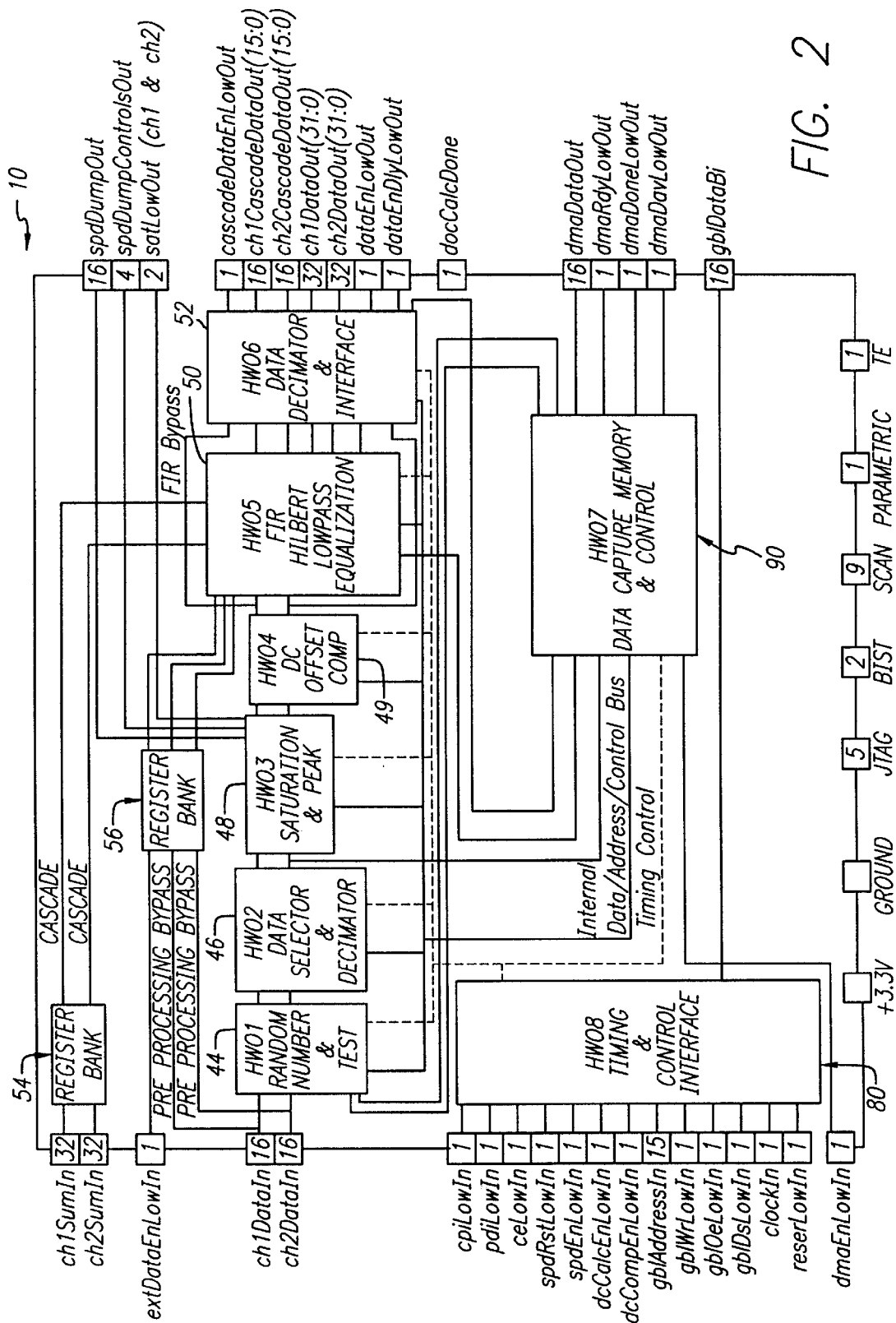
FIG. 2 is a schematic diagram of a portion of the general purpose filter of FIG. 1.

FIG. 2 is a schematic diagram of a portion of the general purpose filter of FIG. 1. In the illustrative embodiment, the system 10 is implemented as a general purpose digital filter (GPF) chip with 128 multiply-add filter cells fabricated in 0.35 micron CMOS technology. Using current technology and the present teachings, the chip 10 may be designed by one of ordinary skill in the art, to operate at rates up to 60 MHz with an asynchronous master reset. In the preferred embodiment, the chip 10 has two 16 bit input channels, two 32 bit output channels, a chip enable and a microprocessor interface.

In the illustrative embodiment, two input ports I and Q allow 128 filter cells to be shared between two data paths. This allows the input data to processed as two separate pieces of data or as complex data. Each path may be configured as a 16 tap arbitrary phase filter, a 32 tap filter or a 128 tap single channel filter. As discussed below, coefficient double buffering and clock synchronization logic permit the user to switch between coefficient sets without causing any undesirable effects in the filter's operation.

A microprocessor compatible bus 52, (consisting of a 16 input address bus, a 16-bit bi-directional data bus, a read/write bit, and a control select), is connected to each element in the system 10 and provides read/write access to programmable internal registers therein. As discussed below, these internal registers are double buffered (see FIG. 5) to allow the chip to switch to new settings upon receipt of an external sync pulse. Consequently, a one clock update cycle is required to update the new settings.

The system 10 is partitioned into 8 functional blocks: a Random Number Generator (RNG) 44, a Data Selector & Interface (DSI) 46, a Saturation & Peak Detector (SPD) 48, a DC Offset Compensation (DOC) 49, a Finite Impulse Response filter (FIR) 50, a Data Decimator & Interface (DCI) 52, a Timing & Control Interface (TCI) 80, and a Data Capture Memory (DCM) 90. Each of these elements is of conventional design.

Banks of registers 54 and 56 are disposed along the data path in order to insure proper alignment of input data, sum data and data enable signals. In addition, the General Purpose Filter Chips may be "chained" together to create a larger multi-tap FIR without requiring additional external buffering.

The RNG 44 is a programmable pseudo-random number generator that allows for a known sequence of numbers to be inserted into the front-end of the data path for self-test purposes. The data sequence for each of the channels is based on the mode and seed values programmed into the number generator. The RNG 44 allows for 12, 14 or 16 bit operation and the data output can either be a constant value, a pseudo random pattern, DCM data or input data.

The DSI 46 is a programmable module that provides data selection and decimation. It provides odd/even data samples and has independent decimation rates for the data path channels and the DCM 90.

The SPD 48 is a general purpose, dual channel, programmable saturation and peak detector. Separate saturation counters, saturation flags, threshold values and peak value data registers are provided for each channel. A saturation occurs when the absolute value of valid channel data is greater than that channel's programmed threshold value. The peak data, over the specified sample period, is determined by identifying the maximum squared value of non-saturated channel data. When a channel's peak value is identified, data for both channels is stored in memory.

The DOC 49 allows for a DC offset value to be calculated over a specified number of samples and then, if enabled, have the offset term removed from the input data stream. In the illustrative embodiment, valid data sample sizes for DC offset calculations are powers of 2, ranging from 2 to 256.

Figure 3:
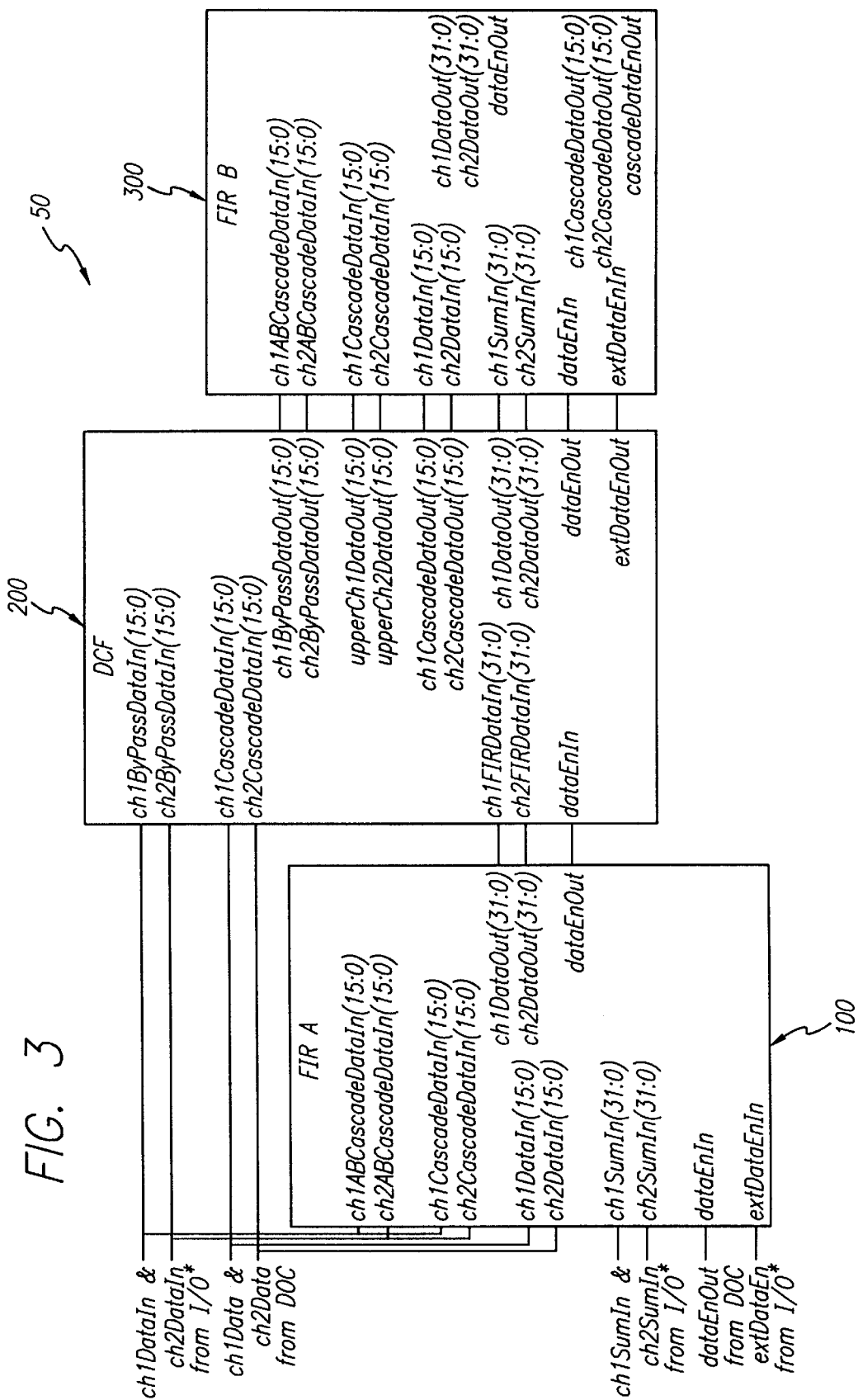
FIG. 3 is a block diagram of the FIR filter utilized in the general purpose filter of the present invention.

FIG. 3 is a block diagram of the FIR filter 50. As illustrated in FIG. 3, the FIR 50 includes the following 3 sub-modules: FIRA 100, DCF 200, and FIRB 300. FIRA and FIRB are identical FIR sub-modules. It is important to note that data from the I/O is pipelined prior to the FIRB block. This is necessary to maintain data alignment along the data path.

Figure 4:
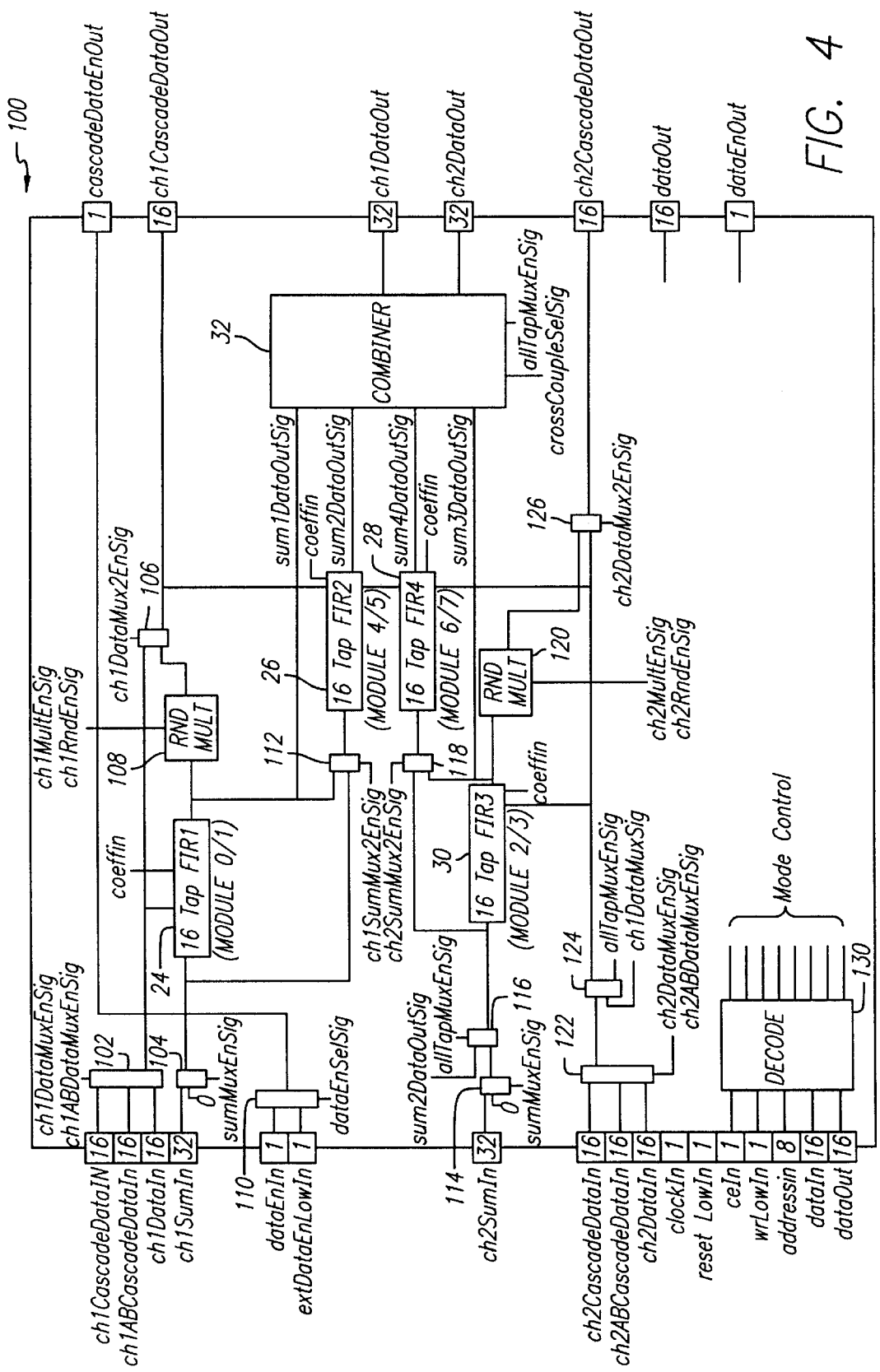
FIG. 4 is a block diagram of an FIR sub-module utilized in the general purpose filter of the present invention.

FIG. 4 is a block diagram of an FIR sub-module 100. Each FIR sub-module 100 is a programmable transposed canonical FIR filter. The sub-module can be configured as a two channel, 16 tap delay Hilbert Transform filter followed by a 16 tap filter, a 32 tap FIR filter, a 64 tap single channel FIR filter, or a 2 channel, 16 tap cross-coupled FIR filter. There is a rounding option between the two filters. The type of FIR filter (i.e. low pass, band pass, high pass) is determined by the coefficient values. The programmable coefficients are double buffered to allow the user to switch between coefficients without affecting the filter's operation.

Figure 5:
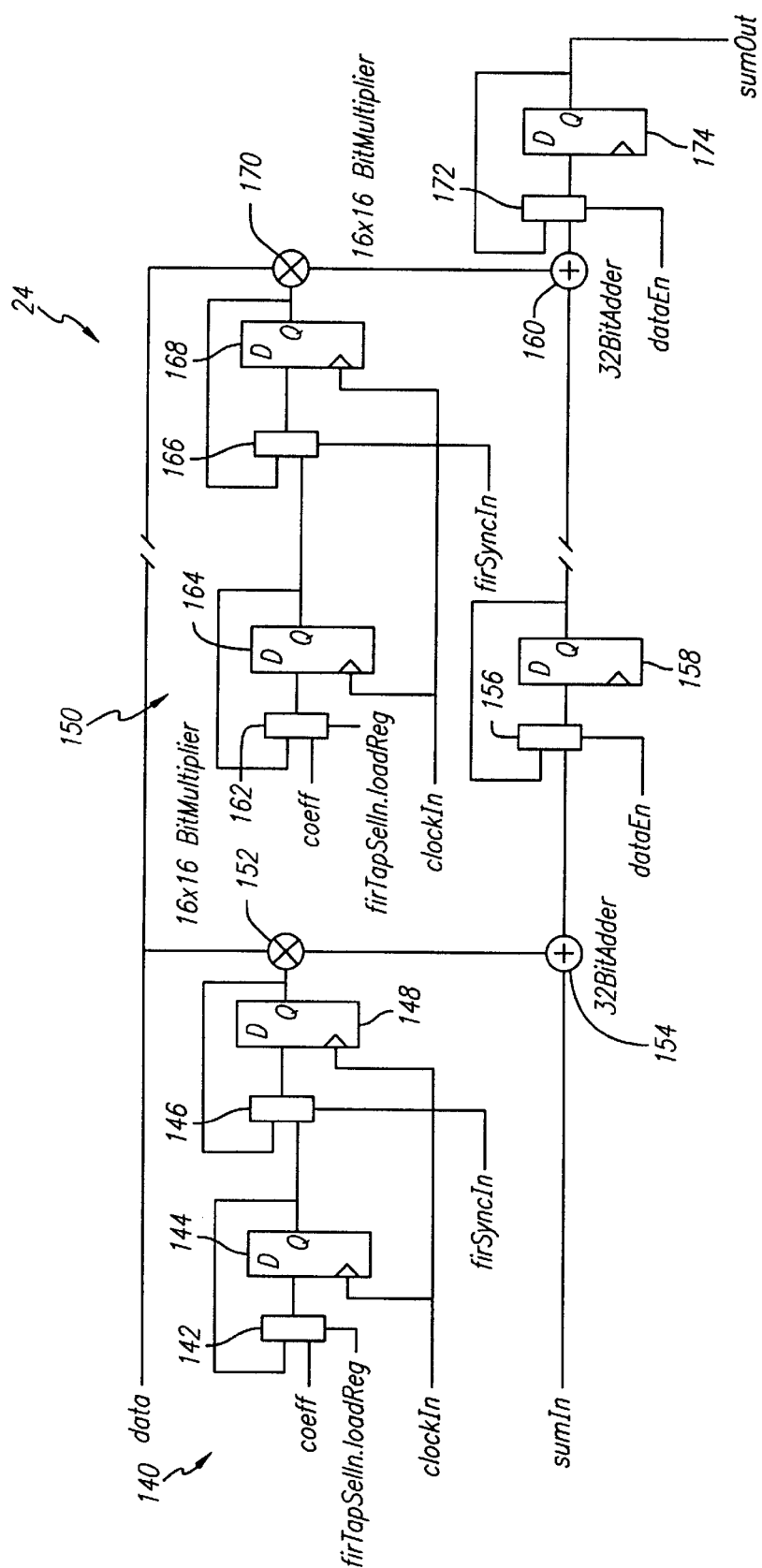
FIG. 5 is a block diagram of an individual FIR filter cell utilized in the general purpose filter of the present invention.

FIG. 5 is a block diagram of an individual 16-tap FIR filter cell 24. It should be noted that FIG. 5 shows only 2 of the filter's 16 taps. The first tap 140 includes a multiplexer 142 having an output connected to the input of a buffer register 144. The input to the multiplexer is a coefficient supplied by the microprocessor 50 of FIG. 1. The output of a buffer register 144 is connected to an operational register 148. As mentioned above, the double buffering arrangement allows the chip to switch to new settings upon receipt of an external sync pulse. Consequently, a single clock update cycle is required to update the new settings. The output of the operational register 148 is supplied to a multiplier 152 which provides a product of the coefficient input to the buffer register 144 and input data to a summer 154 where it is added to any accumulated sum from previous taps and/or filters. The output of the summer 154 is input to a third register 158 from which it is selectively supplied to a second summer 160 under control of the timing circuit 80. The second summer adds the sum of the product provided by the second tap 150. The second tap 150 is identical to the first tap 140. The output of the second summer 160 is stored in the third register 174 for output.

Returning to FIG. 3, the DCF is a decimator and control for finite impulse response filters. In addition to allowing for data decimation to occur between FIRA and FIRB, the DCF provides decimated FIRA data to the DCM. The decimation rate is programmable and allows for separate rates to be specified for FIRB and the DCM.

Returning to FIG. 2, the DCI 52 is a programmable, dual channel, data decimator that serves as an interface for the FIR 50 to the DCM 90 and external I/O. In non-bypass mode, the input data can be decimated, and presented to the output channel. The decimation rate for data out is independent of the decimation rate for RAM data. In the bypass mode, the data is not decimated and appears at the outputs unmodified. In this mode, the lower 16 bits are set to zero. There is a rounding option available at the data output stage.

The DCM 90 is a programmable memory module that allows input or output data from both channels to be captured. There are three points along the data path where data can be captured. The DSI 46, DCF 200 and DCI 52 all provide the DCM 90 with data. In the illustrative embodiment, the DCM's memory is configured as two 512×16 RAMs and has a maximum input data rate of 30 MHz. These samples can be read by the microprocessor 50 (FIG. 1). Data can be externally or internally triggered with or without a delay from the trigger to the time data is captured.

The TCI 80 handles the general timing, control, and interface requirements for the GPF. The 4 major functions of the TCI are a microprocessor interface, data path control, AGC timing control and equalization timing control. In addition to each module's enable and data strobe signals, the TCI allows information to be sent over the microprocessor compatible bus. The bus has a 16-bit data I/O port, a 16 bit address port, a read/write bit, and a control select strobe. The control registers, coefficient registers, and DCM RAM are memory mapped into the 16 bit address space.

On chip diagnostic circuits are provided to simplify system debug and maintenance. The GPF has IEEE 1149.1 compliant boundary scan for board level test, scan for internal fault isolation, and Built-In Self Test (BIST) for internal memory verification. The boundary scan interface allows shifting of test data to and from the chips on a board for testing the integrity of the I/O. Scan circuitry provides access and visibility to internal registers, allowing for easy testing of combinatorial logic and checking register integrity. BIST verifies internal memory by writing and reading various patterns.

Signal Descriptions and Memory Map

In the illustrative embodiment, the address bus is 16 bits wide and is partitioned as follows: the 4 MSBs make up the base address which identifies a particular GPF functional block, 1 bit is for growth and the 10 LSBs are for local addressing. An illustrative description of the input and output signals is shown in Table 1. (Note: The signal description provided in Table 1 is copyrighted by the present assignee and provided for the purpose of illustration only. A copying or creation of a derivative work from the signal description in Table 1 without the prior express written permission of the present assignee is expressly prohibited under U.S. and International Copyright Laws.)

An illustrative memory map is shown in Table 2. (Note: The memory map provided in Table 2 is copyrighted by the present assignee and provided for the purpose of illustration only. A copying or creation of a derivative work from the memory map in Table 2 without the prior express written permission of the present assignee is expressly prohibited under U.S. and International Copyright Laws.)

Functional Timing

Figure 6:
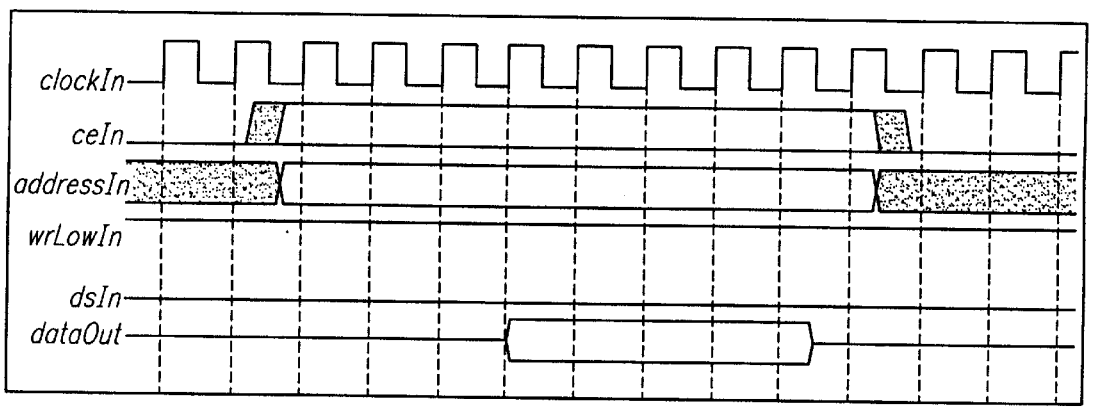
FIG. 6 is an illustrative functional timing for a microprocessor read operation from the general purpose filter of the present invention.

Illustrative functional timing for a microprocessor read operation from the GPF is shown in FIG. 6. The enable signal ceIn indicates the beginning of a processor read/write cycle. After the address bus addressIn and wrLowIn are decoded, data from the memory location is put onto the data bus dataBi during the period when ceIn is active.

Figure 7:
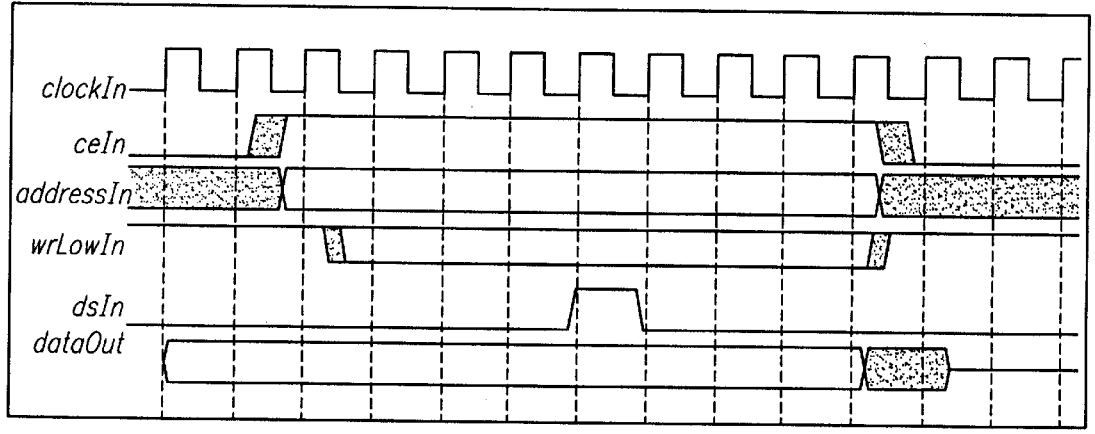
FIG. 7 is an illustrative functional timing for a microprocessor write operation to the general purpose filter of the present invention.

Illustrative functional timing for a microprocessor write operation to the GPF is shown in FIG. 7. The enable signal ceIn indicates the beginning of a processor read/write cycle. After the address bus addressIn and wrLowIn are decoded, the location is written to on the rising edge of clockIn during the period when dsIn is active.

Figure 8:
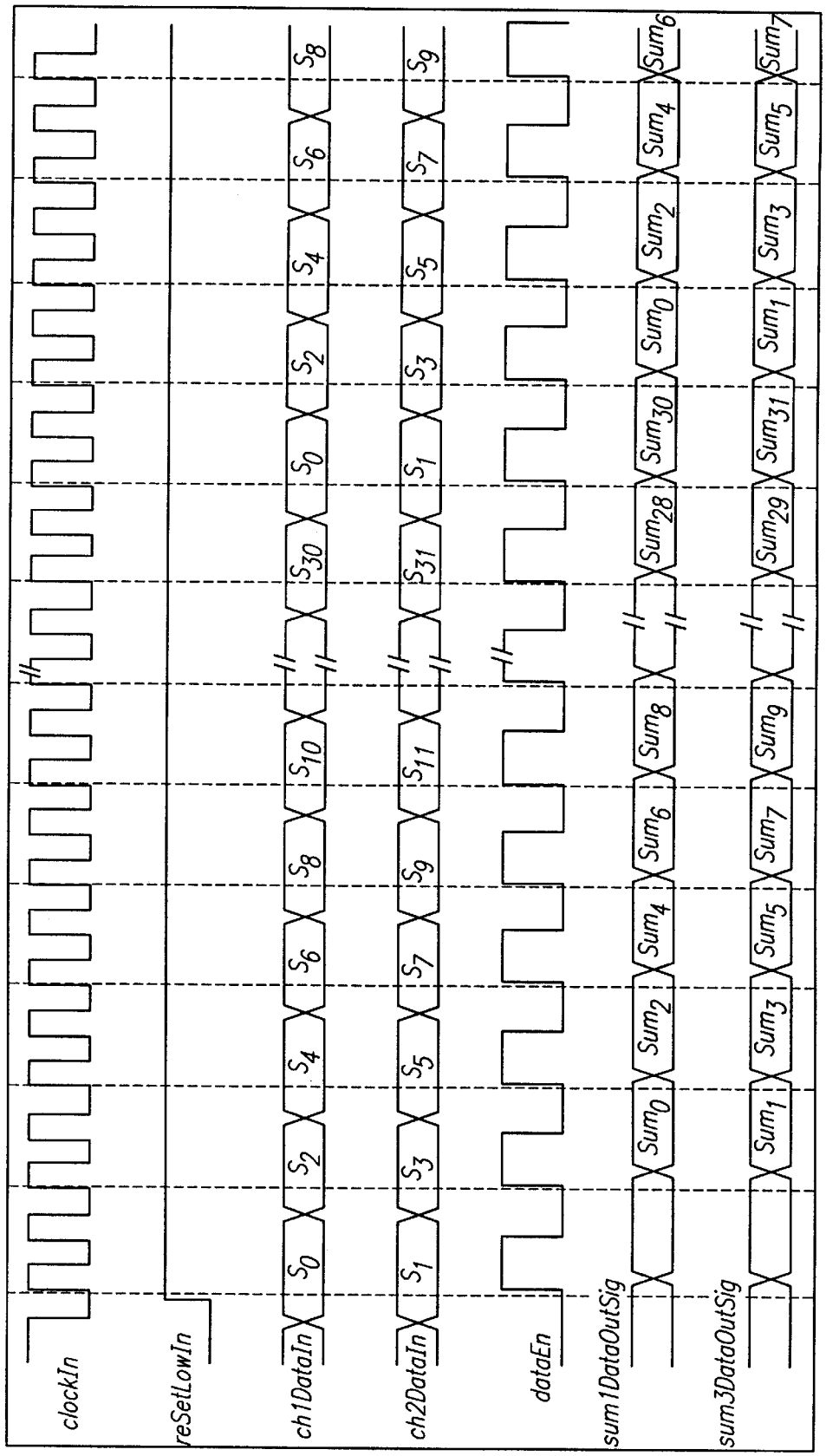
FIG. 8 is an illustrative functional timing diagram for the Hilbert Transform Mode of the general purpose filter of the present invention.

Illustrative functional timing for the Hilbert Transform Mode is shown in FIG. 8.

Equalization System

Figure 9:
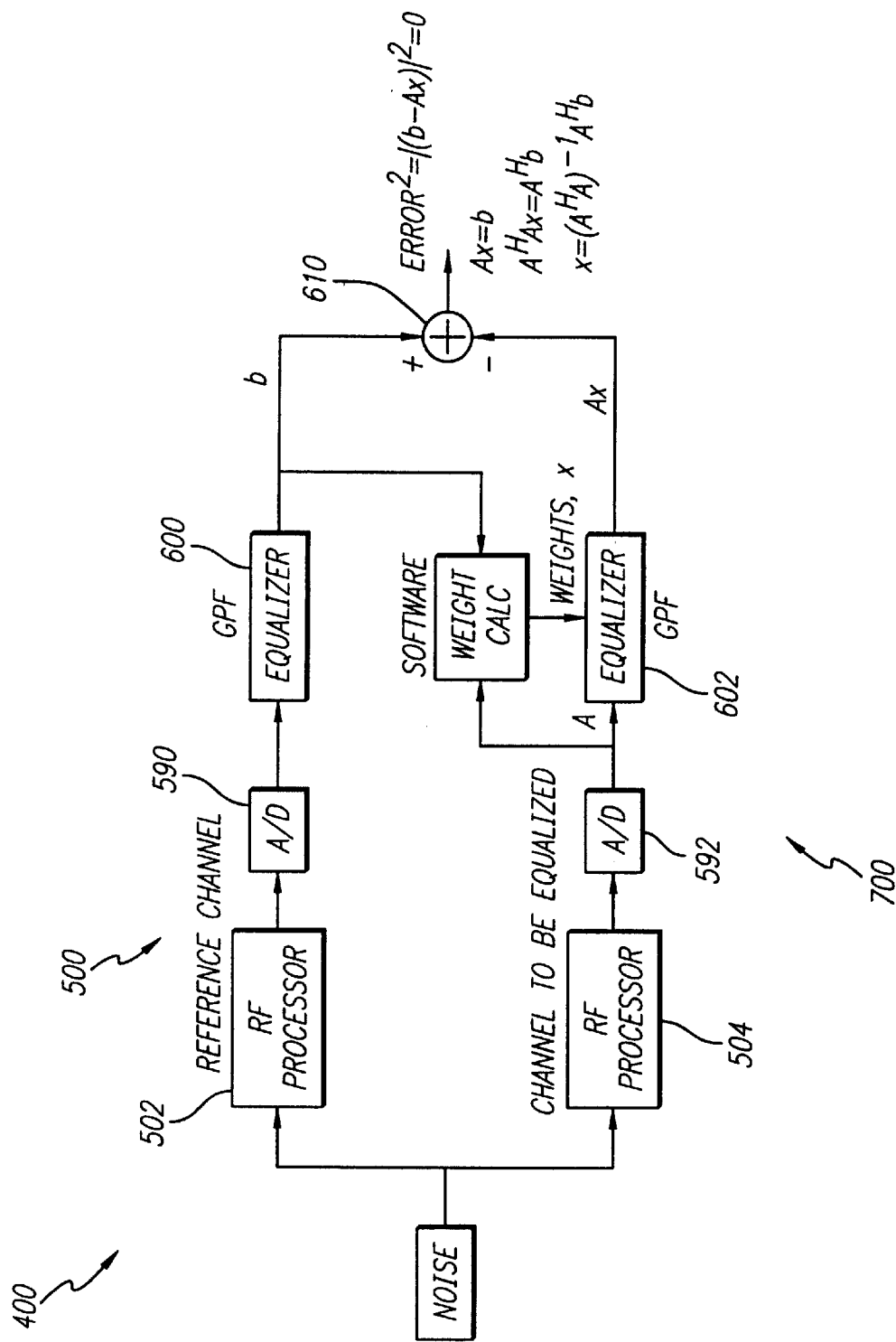
FIG. 9 is a block diagram of a digital receiver incorporating the equalization system of the present invention.

FIG. 9 is a block diagram of a digital receiver incorporating the equalization system of the present invention. As shown in FIG. 9, the receiver 400 includes first and second channels 500 and 700. The first channel 500 represents a reference channel and the second channel 700 represents a channel to be equalized. The first channel 500 includes a radio frequency (RF) processor 502, an analog to digital (A/D) converter 590 and a general purpose filter configured in the manner disclosed more fully below to provide an equalizer. Similarly, the second channel 700 includes an RF processor 504, a second A/D converter 592 and a second general purpose filter 602 configured to provide equalization. The output of the second filter 602 is inverted so that the summing circuit 610 outputs a difference between the two channels 500 and 700.

Figure 10:
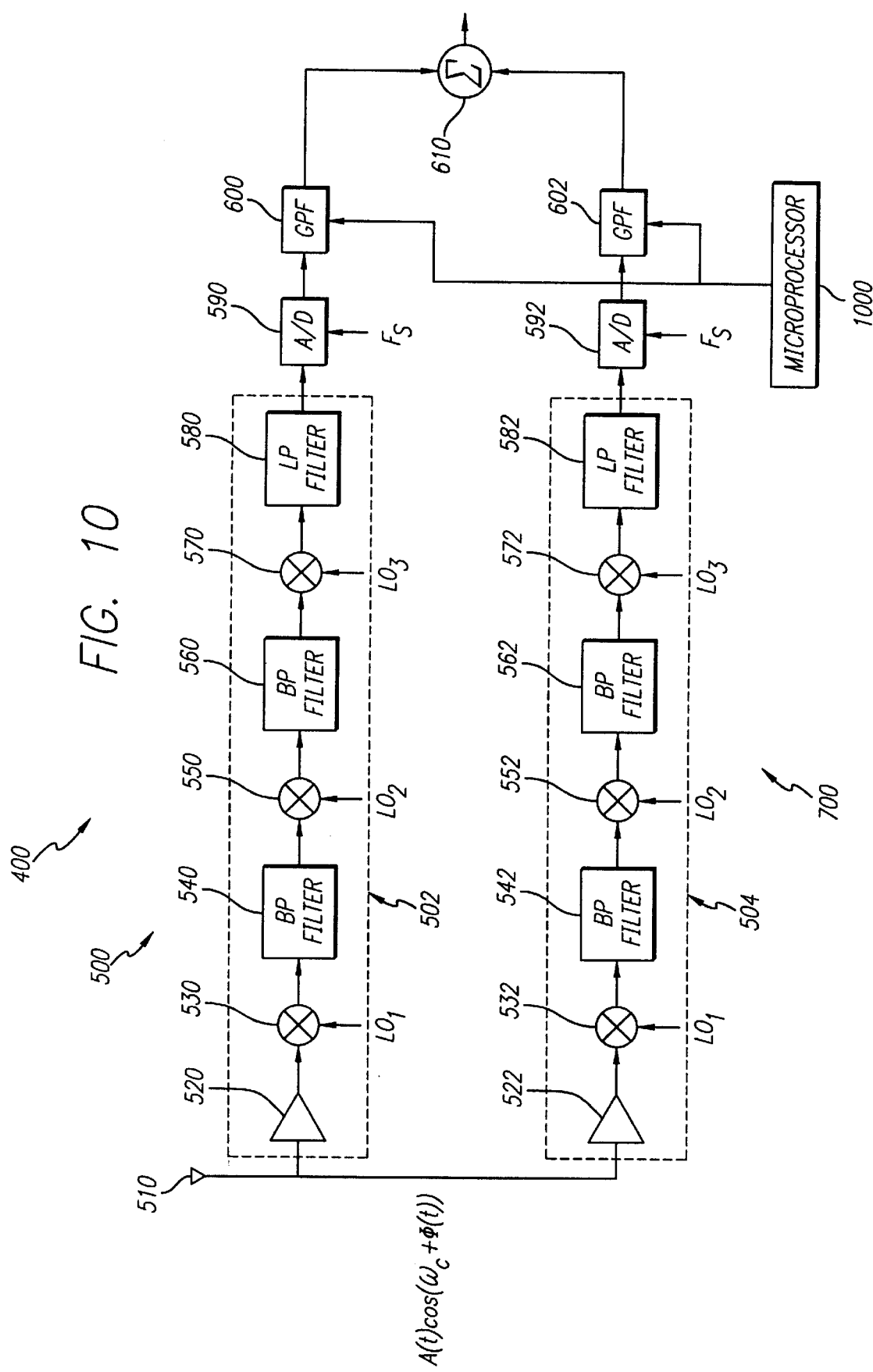
FIG. 10 is a more detailed diagram of the digital receiver of FIG. 9.

FIG. 10 is a more detailed diagram of the digital receiver of FIG. 9. The RF receiver 400 includes a four quadrant phased array antenna 510. The antenna 510 feeds low noise amplifiers 520 and 522 disposed in the reference and equalized channels, respectively. The output of each amplifier 520, 522 is fed to a first local oscillator 530, 532, respectively. The output of the local oscillator 530 is provided to a first band pass filter 540 and the output of the local oscillator 532 is provided to a first band pass filter 542. The output of the first band pass filter 540 is provided to a second local oscillator 550 which feeds a second band pass filter 560. The output of the second band pass filter is input to a third local oscillator 570. The output of the third local oscillator 570 is provided to a low pass filter 580. The low pass filter 580 feeds the analog to digital (A/D) converter 590.

For the equalization channel, the output of the first band pass filter 542 is provided to a second local oscillator 552 which feeds a second band pass filter 562. The output of the second band pass filter is input to a third local oscillator 572. The output of the third local oscillator 572 is provided to a low pass filter 582. The low pass filter 582 feeds the analog to digital (A/D) converter 592.

In the best mode, the general purpose filters 600 and 602 are implemented in accordance with the teachings provided herein.

FIG. 11 shows an illustrative configuration of a general purpose filter 600 or 602 such as that disclosed herein configured to provide equalization in accordance with the teachings of the present invention. Each filter 600, 602 includes the first, second, third and fourth finite impulse response filters 24, 26, 28 and 30, respectively, discussed above with reference to FIG. 1. However, for equalization, the first and second FIR filters 24 and 26 share a digitized in-phase input (I) from the receiver 502 or 504 while the second and third FIR filters 28 and 30 share a quadrature input (Q) from the receiver 502 or 504. As discussed more fully below, each FIR filter is provided with a set of coefficients to effect equalization. A combiner 32 subtracts the outputs of the first and third filters 24 and 28 to provide an equalized in-phase component I' and adds the outputs of the second and fourth filters 26 and 30 to provide an equalized quadrature component.

In accordance with the present teachings, the coefficients of the general purpose filters are selected and provided by a microprocessor 1000 so that an error signal output by the summing circuit 610 is zero.

The error signal is given by the relation:

$$\mathrm{ERROR}^2 = (B - Ax)^2 = 0 \qquad [1]$$

where b is the reference channel output, A is a matrix representing the output of the channel to be equalized and x is represents the weights to be applied to the output of the general purpose filter 602 of the channel to be equalized.

In simple terms, since:

$$Ax = b \qquad [2]$$

then $$A^H A x = A^H b \qquad [3]$$

and therefore $$x = (A^H A)^{-1} A^H b. \qquad [4]$$

Figure 12:
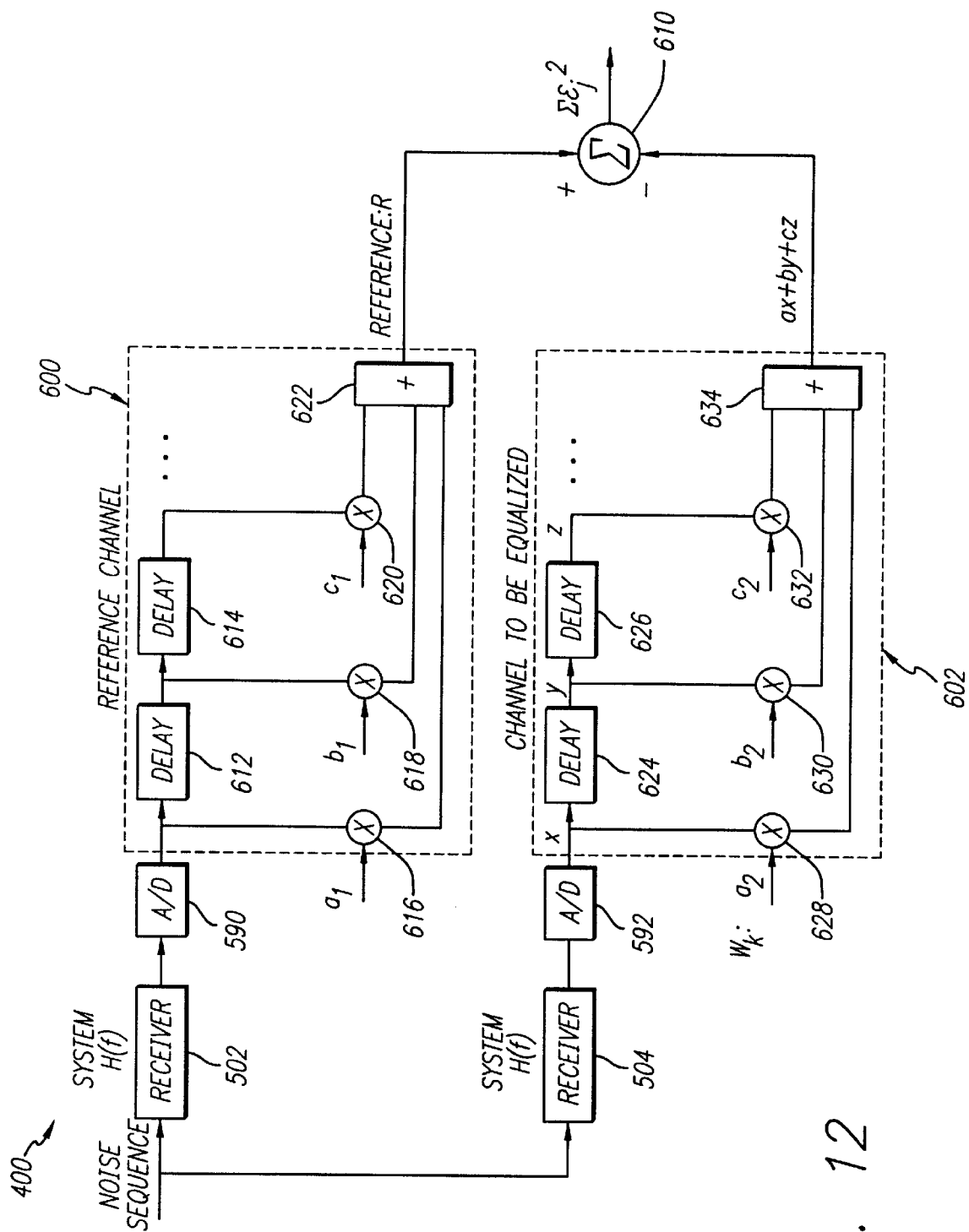
FIG. 12 is a simplified diagram of the receiver of FIGS. 9 and 10 which illustrates functional operation of the general purpose filters adapted to effect equalization in accordance with the present teachings.

FIG. 12 is a simplified diagram of the receiver of FIGS. 9 and 10 which illustrates functional operation of the general purpose filters adapted to effect equalization in accordance with the present teachings. As mentioned above, each general purpose filter 600, 602 includes a number of FIR filters which provide delay elements 612, 614, 624 and 626. Taps are provided between each of the delay elements which are multiplied by coefficients by multipliers 616, 618, 620, 628, 630 and 632. In the first general purpose filter 600, the outputs of the multipliers 616, 618, and 620 are summed by a combiner 622. In the second filter 602, the outputs of the multipliers 628, 630 and 632 are summed by a second combiner 634. In practice, the combiners 622 and 634 of FIG. 12 are implemented within by the combiner 32 of FIG. 11. The combiners 622 and 634 provide the outputs of the first and second general purpose filters 600 and 602 respectively.

The outputs of the first and second general purpose filters 600 and 602 are combined by the subtractor 610 to yield a squared error output $\Sigma \epsilon_j^2$ given by the relation:

$$\Sigma \epsilon_j^2 = \Sigma [rj-(a2xj+b2yj+c2zj\ldots)]^2, \qquad [5]$$

j=1 to M snapshots

FIG. 13 shows an illustrative sample set A, a weight set W and a reference set r.

FIG. 14 is a diagram which depicts an illustrative technique utilized to determine the weights for the receiver 400 of the present invention. The surface 640 represents the best estimates of weights using the well known 'mean squared error' technique. That is, since the product of the weight set W and the sample set A yields the reference set r:

$$Aw = r \qquad [6]$$

then $$W = (A^H A)^{-1} A^H r. \qquad [7]$$

where $(A^H A)^{-1}$ represents the correlation between tap inputs and $A^H r$ represents the cross correlation between tap inputs and a desired response.

Those skilled in the art will appreciate that any one of a number of mathematical techniques may be used to compute the weights used to provide the coefficients discussed above.

Thus, the present invention has been described herein with reference to a particular embodiment for a particular application. Those having ordinary skill in the art and access to the present teachings will recognize additional modifications, applications and embodiments within the scope thereof.

It is therefore intended by the appended claims to cover any and all such applications, modifications and embodiments within the scope of the present invention.

TABLE 1

Signal I/O Description

| PIN NAME | SIZE | TYPE | FUNCTION |
| --- | --- | --- | --- |
| ch1SumIn(31:0) | 32 | Input | Input sum for channel 1 |
| ch2SumIn(31:0) | 32 | Input | Input sum for channel 2 |
| ch1DataIn(15:0) | 16 | Input | Input data for channel 1 |
| ch2DataIn(15:0) | 16 | Input | Input data for channel 2 |
| dataEnLowIn | 1 | Input | ch1, ch2 data input rate strobe (from DOC) |
| ExtDataEnLowIn | 1 | Input | ch1, ch2 data input rate strobe (from I/O) |
| outputEnLowIn | 1 | Input | Chip output enable |
| dmaEnLowIn | 1 | Input | Enables the Data Capture RAM Memory |
| cpiLowIn | 1 | Input | Coherent processing interval input |
| pdiLowIn | 1 | Input | Pulse detection interval |
| ceLowIn | 1 | Input | Chip Enable |
| spdEnLowIn | 1 | Input | Disable Saturation & Peak Detection |
| spdDumpLowIn | 1 | Input | Dump data from Saturation & Peak Detection |
| dcCompEnLowIn | 1 | Input | Enable dc compensation |
| dcCalcEnLowIn | 1 | Input | Enable dc offset calculation |
| gblAddressIn | 16 | Input | Global address from external processor |
| gblWrLowIn | 1 | Input | Global bus read/write strobe |
| gblOeLowIn | 1 | Input | Global bus output enable |
| gblDsLowIn | 1 | Input | Global data strobe |
| gblCeLowIn | 1 | Input | Global chip select strobe |
| resetLowIn | 1 | Input | Power up reset for asic |
| clockIn | 1 | Input | 60 MHz clock |
| testEnIn | 1 | Input | Test - LSI Logic required for setting bi-directionals to inputs and tri-states off |
| tdiIn | 1 | Input | Test - boundary scan data input |
| tmsIn | 1 | Input | Test - boundary scan mode select |
| tckIn | 1 | Input | Test - boundary scan clock |
| trstIn | 1 | Input | Test - boundary scan asynchronous reset |
| bistModeIn | 2 | Input | Test - enable the memory BIST |
| scanEnIn | 1 | Input | Test - scan mode enable for test |
| scan1In | 1 | Input | Test - scan input #1 |
| scan2In | 1 | Input | Test - scan input #2 |
| scan3In | 1 | Input | Test - scan input #3 |
| scan4In | 1 | Input | Test - scan input #4 |
| procMonEnIn | 1 | Input | Test - Enable the parametric nand tree |
| ch1SatLowOut | 1 | Output | Output indicates saturation |
| ch2SatLowOut | 1 | Output | Output indicates saturation |
| spdDumpOut | 16 | Output | Saturation & peak detection module data dump |
| spdDumpEnLowOut | 1 | Output | Saturation & peak detection module data dump enable |
| spdDumpDoneLowOut | 1 | Output | Saturation & Peak detection module data dump done |
| ch1DataOut(31:0) | 32 | Output | Output sum data for channel 1 |
| ch2DataOut(31:0) | 32 | Output | Output sum data for channel 2 |
| dataEnLowOut | 1 | Output | Ch1 & ch2 output data valid |
| dataEnLowDlyOut | 1 | Output | Ch1 & ch2 output data valid (program delay) |
| dmaDataOut | 16 | Output | Output capture of data |
| dmaDavLowOut | 1 | Output | Indicates each dma data sample valid |

TABLE 1-continued

Signal I/O Description

| PIN NAME | SIZE | TYPE | FUNCTION |
|---|---|---|---|
| dmaRdyLowOut | 1 | Output | Indicates dma capture memory full and ready to clock data out |
| dmaDoneLowOut | 1 | Output | Indicates capture of data complete |
| calcDoneLowOut | 1 | Output | Indicates DOC calculation complete |
| gblRdyLowOut | 1 | Output | Indicates end of read/write cycle |
| tdoOut | 1 | Output | Test - boundary scan output |
| scan1Out | 1 | Output | Test - scan output #1 |
| scan2Out | 1 | Output | Test - scan output #2 |
| scan3Out | 1 | Output | Test - scan output #3 |
| scan4Out | 1 | Output | Test - scan output #4 |
| bistDoneOut | 1 | Output | Test - BIST output done when high |
| bistErrorOut | 1 | Output | Test - BIST error occurs when low |
| procMonOut | 1 | Output | Test - parametric nand tree output |
| tstDcmFsmOut | 5 | Output | Test - DCM state machine |
| tstDocCalcStateOut | 2 | Output | Test - DOC DC offset compensation state machine |
| gblDataBi | 16 | Bidirect | 16 bit bi-directional global data bus to external processor |

TABLE 2

Memory Map

| | | | | 15-12 bits<br>Base Address | | 11 bit<br>Growth | | 10-0 bits<br>Address Field |
|---|---|---|---|---|---|---|---|---|
| Base<br>Addr | Offset<br>Addr | Item | Module | Access | Data<br>Size<br>(bits) | Initial<br>Value | Description | |
| 0000h | 0h | LFSR modeB | RNG | R/W | 2 | 0h | Determines LFSR & RNG mode (Buffered)<br>0h => Tactical<br>1h => Data from DCM<br>2h => LFSR enabled to count<br>3h => LFSR outputs constant value (seed) | |
| | 1h | Seed 1B | RNG | R/W | 16 | 0h | Channel 1 LFSR seed (Buffered) | |
| | 2h | Seed 2B | RNG | R/W | 16 | 0h | Channel 2 LFSR seed (Buffered) | |
| | 3h | Data WidthB | RNG | R/W | 2 | 2h | Input Data Width (Buffered)<br>0h => 12 bit input data<br>1h => 14 bit input data<br>2h => 16 bit input data<br>3h => 12 bit input data | |
| | 4h | LFSR mode | RNG | R | 2 | 0h | Determines LFSR & RNG mode<br>0h => Tactical<br>1h => Data from DCM<br>2h => LFSR enabled to count<br>3h => LFSR outputs constant value (seed) | |
| | 5h | Seed 1 | RNG | R | 16 | 0h | Channel 1 LFSR seed | |
| | 6h | Seed 2 | RNG | R | 16 | 0h | Channel 2 LFSR seed | |
| | 7h | Data Width | RNG | R | 2 | 2h | Input Data Width<br>0h => 12 bit input data<br>1h => 14 bit input data<br>2h => 16 bit input data<br>3h => 12 bit input data | |
| 1000h | 0h | Data Dec Rate Buf | DSI | R/W | 12 | 1h | Data path decimation rate Out of DSI block (Buffered) | |
| | 1h | RAM Dec Rate Buf | DSI | R/W | 12 | 1h | DCM data decimation rate out of DSI block (Buffered) | |
| | 2h | Transform Select Buf | DSI | R/W | 1 | 0h | Data select. Odd/Even or true 2 channel data (Buffered)<br>0h => Samples from Channels 1 & 2<br>1h => Odd/even samples from Channel 1 | |
| | 3h | Data Dec Rate | DSI | R | 12 | 1h | Data path decimation rate out of DSI block | |
| | 4h | RAM Dec Rate | DSI | R | 12 | 1h | DCM data decimation rate out of DSI block | |
| | 5h | Transform Select | DSI | R | 1 | 0h | Data select. Odd/Even or true 2 channel data<br>0h => Samples from Channels 1 & 2<br>1h => Odd/even samples from Channel 1 | |
| 2000h | 0h | ThresholdB | SPD | R/ | 16 | 7FFFh | Buffered Threshold Value | |
| | 1h | Sat1CountB | SPD | R | 16 | 0h | Buffered Number of Channel 1 Saturated Samples | |
| | 2h | Sat2CountB | SPD | R | 16 | 0h | Buffered Number of Channel 2 Saturated Samples | |
| | 3h | Pk1Ch1ValB | SPD | R | 16 | 0h | Buffered Channel 1 Peak Value | |
| | 4h | Pk1Ch2ValB | SPD | R | 16 | 0h | Buffered Channel 2 Associated Value | |
| | 5h | Pk2Ch1ValB | SPD | R | 16 | 0h | Buffered Channel 1 Associated Value | |
| | 6h | Pk2Ch2VaBl | SPD | R | 16 | 0h | Buffered Channel 2 Peak Value | |
| | 7h | Sat1Count | SPD | R/W | 16 | 0h | Number of Channel 1 Saturated Samples | |
| | 8h | Sat2Count | SPD | R/W | 16 | 0h | Number of Channel 2 Saturated Samples | |
| | 9h | Pk1Ch1Val | SPD | R/W | 16 | 0h | Channel 1 Peak Value | |

TABLE 2-continued

Memory Map

| | | | | 15-12 bits<br>Base Address | 11 bit<br>Growth | 10-0 bits<br>Address Field | | |
|---|---|---|---|---|---|---|---|---|
| Base<br>Addr | Offset<br>Addr | Item | Module | Access | Data<br>Size<br>(bits) | Initial<br>Value | Description | |
| | Ah | Pk1Ch2Val | SPD | R/W | 16 | 0h | Channel 2 Associated Value | |
| | Bh | Pk2Ch1Val | SPD | R/W | 16 | Ch | Channel 1 Associated Value | |
| | Ch | Pk2Ch2Val | SPD | R/W | 16 | 0h | Channel 2 Peak Value | |
| | Dh | Threshold | SPD | R/W | 16 | 7FFFh | Threshold Value | |
| 3000h | 0h | Sample Size Buffered | DOC | R/W | 9 | 2h | Buffered DC compensation sample size | |
| | 1h | Sample Size | DOC | R | 9 | 2h | DC compensation sample size | |
| | 2h | Ch1 Comp | DOC | R | 16 | 0h | Channel 1 DC compensation value | |
| | 3h | Ch2 Comp | DOC | R | 16 | 0h | Channel 2 DC compensation value | |
| 4000h | 00-07h | Buf Coefficients Mod 0 | FIRA | R/W | 16 | 0h | Buffered Module 0 Tap 0-7 coefficients | |
| | 08-0Fh | Buf Coefficients Mod 1 | FIRA | R/W | 16 | 0h | Buffered Module 1 Tap 0-7 coefficients | |
| | 10-17h | Buf Coefficients Mod 2 | FIRA | R/W | 16 | 0h | Buffered Module 2 Tap 0-7 coefficients | |
| | 18-1Fh | Buf Coefficients Mod 3 | FIRA | R/W | 16 | 0h | Buffered Module 3 Tap 0-7 coefficients | |
| | 20-27h | Buf Coefficients Mod 4 | FIRA | R/W | 16 | 0h | Buffered Module 4 Tap 0-7 coefficients | |
| | 28-2Fh | Buf Coefficients Mod 5 | FIRA | R/W | 16 | 0h | Buffered Module 5 Tap 0-7 coefficients | |
| | 30-37h | Buf Coefficients Mod 6 | FIRA | R/W | 16 | 0h | Buffered Module 6 Tap 0-7 coefficients | |
| | 38-3Fh | Buf Coefficients Mod 7 | FIRA | R/W | 16 | 0h | Buffered Module 7 Tap 0-7 coefficients | |
| | 40h | Buf FIRA Mode Reg 1 | FIRA | R/W | 16 | 0h | Buffered FIRA Control Register 1<br>Bits 1 - 0 = ch1DataMuxEnSig.<br>ch1ABDataMuxEnSig<br>0h => Mux selects ch1CascadeDataIn<br>1h => Mux selects ch1ABCascadeDatIn<br>2h => Mux selects ch1DataIn<br>3h => Mux selects zero<br>Bits 3 - 2 = ch2DataMuxEnSig.<br>ch2ABDataMuxEnSig<br>0h => Mux selects ch2CascadeDataIn<br>1h => Mux selects ch2ABCascadeDatIn<br>2h => Mux selects ch2DataIn<br>3h => Mux selects zero<br>Bit 4 = ch1 MultEnsig; Enables Ch1 phase shifting.<br>0h => Disabled<br>1h => Enabled<br>Bit 5 = ch2MultEnSig; Enables Ch2 phase shifting.<br>0h => Disabled<br>1h => Enabled<br>Bit 6 = ch1RndEnSig; Enables Ch1 rounding.<br>0h => Disabled<br>1h => Enabled<br>Bit 7 = ch2RndEnSig; Enables Ch2 rounding.<br>0h => Disabled<br>1h => Enabled<br>Bit 8 = ch1 DataMux2EnSig<br>0h => Mux selects data from Ch1 Rnd/Mult<br>1h => Mux selects data from Ch1 data mux 1<br>Bit 9 = ch1SumMux2EnSig<br>0h => Mux selects data from FIR1 sumOut<br>1h => Mux selects data from sumMuxEnsig<br>Bit 10 = ch2DataMux2EnSig<br>0h => Mux selects data from Ch2 Rnd/Mult<br>1h => Mux selects data from Ch2 data mux 1<br>Bit 11 = ch2SumMux2EnSig<br>0h => Mux selects data from FIR3 sumOut<br>1h => Mux selects data from FIR3 sumIn<br>Bit 12 = crossCoupleSelSig; Enables cross<br>coupling of data out of 16 tap FIRs.<br>0h => Disabled<br>1h => Enabled<br>Bit 13 = sumEnSig; Enables Ch1 & Ch2 sum input<br>data.<br>0h => Disables<br>1h => Enables<br>Bit 14 = dataEnSelSig;<br>0h => Mux selects extDataEnLowIn<br>1h => Mux selects dataEnLowIn<br>Bit 15 = allTapMuxEnSig; Allows sum output from<br>FIR2 to be used as sum input to FIR3 and combiner<br>outputs sum data from FIR4 for Ch1 and zeros<br>for Ch2.<br>0h => Disabled<br>1h => Enabled | |

TABLE 2-continued

Memory Map

| | | | | 15-12 bits<br>Base Address | 11 bit<br>Growth | 10-0 bits<br>Address Field | | |
|---|---|---|---|---|---|---|---|---|
| Base<br>Addr | Offset<br>Addr | Item | Module | Access | Data<br>Size<br>(bits) | Initial<br>Value | Description | |
| | 80h | Buf. FIRA Mode Reg 2 | FIRA | R/W | 1 | 0h | Buffered FIRA Control Register 2<br>Bit 15 = Synchronous FIR clear<br>0h => Clear disabled<br>1h => Clear enabled | |
| 4000h | 100-107h | Coefficients Mod 0 | FRA | R | 16 | 0h | Module 0 Tap 0-7 coefficients | |
| | 108-10Fh | Coefficients Mod 1 | FRA | R | 16 | 0h | Module 1 Tap 0-7 coefficients | |
| | 110-117h | Coefficients Mod 2 | FRA | R | 16 | 0h | Module 2 Tap 0-7 coefficients | |
| | 118-11Fh | Coefficients Mod 3 | FRA | R | 16 | 0h | Module 3 Tap 0-7 coefficients | |
| | 120-127h | Coefficients Mod 4 | FRA | R | 16 | 0h | Module 4 Tap 0-7 coefficients | |
| | 128-12Fh | Coefficients Mod 5 | FRA | R | 16 | 0h | Module 5 Tap 0-7 coefficients | |
| | 130-137h | Coefficients Mod 6 | FRA | R | 16 | 0h | Module 6 Tap 0-7 coefficients | |
| | 138-13Fh | Coefficients Mod 7 | FRA | R | 16 | 0h | Module 7 Tap 0-7 coefficients | |
| | 140h | Mode Register 1 | FRA | R | 16 | 0h | Mode 1 Control register<br>Data Bit 0; Read ch1DataMuxEnRSig<br>Data Bit 1; Read ch1ABDataMuxEnRSig<br>Data Bit 2; Read ch2DataMuxEnRSig<br>Data Bit 3; Read ch2ABDataMuxEnRSig<br>Data Bit 4; Read ch1MultEnRSig<br>Data Bit 5; Read ch2MultEnRSig<br>Data Bit 6; Read ch1RndEnRSig<br>Data Bit 7; Read ch2RndEnRSig<br>Data Bit 8; Read ch1MuxEnRSig<br>Data Bit 9; Read ch1SumMux2EnRSig<br>Data Bit 10; Read ch2MuxEnRSig<br>Data Bit 11; Read ch2SumMux2EnRSig<br>Data Bit 12; Read crossCoupledEnRSig<br>Data Bit 13; Read sumEnRSig<br>Data Bit 14; Read dataEnSelRSig<br>Data Bit 15; Read allTapMuxEnRSig<br>Data Bit 15; allTapMuxEnRSig | |
| | 180h | Mode Register 2 | FRA | R | 16 | 0h | Mode 2 Control register<br>Data Bit 0–14; No function<br>Data Bit 15 = 1;Read firClr | |
| 5000h | 0h | Data Dec Rate Buf | DCI | R/W | 12 | 1h | buffered decimation rate for the output data | |
| | 1h | Ram Dec Rate Buf | DCI | R/W | 12 | 1h | buffered decimation rate for the RAM data | |
| | 2h | Bypass Mode Buf | DCI | R/W | 1 | 0h | buffered mode select<br>0h = non-bypass; Data passed through unchanged<br>1h = bypass: Bypass data (16) is passed directly<br>and concatenated with zeros based on the<br>scale format selected. | |
| | 3h | Output Data Format Buf | DCI | R/W | 1 | 0h | buffered data format select<br><br>data not rounded = 0h<br>data rouhded to 16 bits = 1h | |
| | 4h | RAM Data Format Buf | DCI | R/W | 1 | 0h | buffered RAM data format select<br>data not rounded = 0h<br>data rounded to 16 bits = 1h | |
| | 5h | Scale Format Buf | DCI | R/W | 3 | 0h | buffered scale format for output data<br>output is input (round 16) data Bit 31, Bit 30:16 = 0h<br>output is inpuf (round 16) data Bit 31, Bit 29:15 = 1h<br>output is input (round 16) data Bit 31, Bit 28:14 = 2h<br>output is input (round 16) data Bit 31, Bit 27:13 = 3h<br>output is input (round 16) data Bit 31, Bit 26:12 = 4h<br>output is input (round 16) data Bit 31, Bit 25:11 = 5h<br>output is input (round 16) data Bit 31, Bit 24:10 = 6h<br>output is input (round 16) data Bit 31, Bit 23:9 = 7h | |
| 5000h | 6h | RAM Scale Format Buf | DCI | R/W | 3 | 0h | buffered scale tonnat for RAM data<br>output is input (round 16) data Bit 31, Bit 30;16 = 0h<br>output is input (round 16) data Bit 31, Bit 29;15 = 1h<br>output is input (round 16) data Bit 31, Bit 28:14 = 2h<br>output is input (round 16) data Bit 31, Bit 27:13 = 3h<br>output is input (round 16) data Bit 31, Bit 26;12 = 4h | |

TABLE 2-continued

Memory Map

| | | | | 15-12 bits<br>Base Address | 11 bit<br>Growth | 10-0 bits<br>Address Field | |
|---|---|---|---|---|---|---|---|
| Base<br>Addr | Offset<br>Addr | Item | Module | Access | Data<br>Size<br>(bits) | Initial<br>Value | Description |
| | 7h | Data Enable Delayed | DCI | R/W | 4 | 1h | output is input (round 16) data Bit 31, Bit 25;11 = 5h<br>output is input (round 16) data Bit 31, Bit 24;10 = 6h<br>output is input (round 16) data Bit 31, Bit 23;9 = 7h<br>buffered data enable delayed<br>0 clock cycle delay from output data enable = 0h<br>1 clock cycle delay from output data enable = 1h<br>2 clock cycle delay from output data enable = 2h<br>3 clock cycle delay from output data enable = 3h<br>4 clock cycle delay from output data enable = 4h<br>5 clock cycle delay from output data enable = 5h<br>6 clock cycle deray from output data enable = 6h<br>7 clock cycle delay from output data enable = 7h |
| | 8h | Data Dec Hate | DCI | R | 12 | 1h | current decimation rate for the output data |
| | 9h | Ram Dec Rate | DCI | R | 12 | 1h | current decimation rate for the RAM data |
| | Ah | Bypass Mode | DCI | R | 1 | 0h | current mode select<br>non-bypass = 0h<br>bypass mode = 1h |
| | Bh | Output Data Format | DCI | R | 1 | 0h | current data format select<br>data not rounded = 0h<br>data rounded to 16 bits = 1h |
| | Ch | Ram Data Format | DCI | R | 1 | 0h | current RAM data format select<br>data not rounded = 0h<br>data rounded to 16 bits = 1h |
| 5000h | Dh | Scale Format | DCI | R | 3 | 0h | current scale format for output data<br>output is input (round 16) data Bit 31, Bit 30:16 = 0h<br>output is input (round 16) data Bit 31, Bit 29:15 = 1h<br>output is input (round 16) data Bit 31, Bit 28:14 = 2h<br>output is input (round 16) data Bit 31, Bit 27:13 = 3h<br>output is input (round 16) data Bit 31, Bit 26:12 = 4h<br>output is input (round 16) data Bit 31, Bit 25:11 = 5h<br>output is input (round 16) data Bit 31, Bit 24:10 = 6h<br>output is input (round 16) data Bit 31, Bit 23:9 = 7h |
| | Eh | RAM Scale Format | DCI | R | 3 | 0h | current scale format for RAM data<br>output is input (round 16) data Bit 31, Bit 30:16 = 0h<br>output is input (round 16) data Bit 31, Bit 29:15 = 1h<br>output is input (round 16) data Bit 31, Bit 28:14 = 2h<br>output is input (round 16) data Bit 31, Bit 27:13 = 3h<br>output is input (round 16) data Bit 31, Bit 26:12 = 4h<br>output is input (round 16) data Bit 31, Bit 25:11 = 5h<br>output is input (round 16) data Bit 31, Bit 24:10 = 6h<br>output is input (round 16) data Bit 31, Bit 23:9 = 7h |
| | Fh | Data Enable Delayed | DCI | R | 4 | 1h | current data enable delayed<br>0 clock cycle delay from output data enable = 0h<br>1 clock cycle delay from output data enable = 1h<br>2 clock cycle delay from output data enable = 2h<br>3 clock cycle delay from output data enable = 3h<br>4 clock cycle delay from output data enable = 4h<br>5 clock cycle delay from output data enable = 5h<br>6 clock cycle delay from output data enable = 6h<br>7 clock cycle delay from output data enable = 7h |
| 6000h | 000-<br>1FFh | Ch1 Mem | DCM | R/W | 16 | NA | Channel 1 capture memory |
| | 200-<br>3FFh | Ch2 Mem | DCM | R/W | 16 | NA | Channel 2 capture memory |
| | 400h | Buffered Control | DCM | R/W | 16 | 0h | Buffered Data capture control register<br>Bit 0 = 1 - Capture On Sync<br>Bit 1 = 1 - Snapshot Burst Out<br>Bit 2 = 1 - Snapshot Feedback<br>Bits 4,5 - Capture select 00b = DSI,<br>01b = DCI, 10b DCF<br>Bit 11 = 1 - Capture Complete<br>Bit 15 = 1 - Reset (Note: Read back at 0b after you<br>write a 1b)<br>Bits 3,6,7,8,9,10,13,14 - No function |
| | 401h | Dly_BHi | DCM | R/W | 4 | 0h | Delay Counter Buffered High Byte |
| | 402h | Dly_BLo | DCM | R/W | 16 | 1h | Delay Counter Buffered Low Byte |
| | 404h | Control | DCM | R | 16 | 0h | Data capture control register<br>Bit 0 = 1 - Capture On Sync<br>Bit 1 = 1 - Snapshot Burst Out<br>Bit 2 = 1 - Snapshot Feedback |

TABLE 2-continued

| | | | | Memory Map | | | |
|---|---|---|---|---|---|---|---|
| | | | | 15-12 bits<br>Base Address | 11 bit<br>Growth | 10-0 bits<br>Address Field | |
| Base<br>Addr | Offset<br>Addr | Item | Module | Access | Data<br>Size<br>(bits) | Initial<br>Value | Description |
| | | | | | | | Bits 4,5 - Capture select 00b = DSI,<br>01b = DCI, 10b = DCF<br>Bit 11 = 1 - Capture Complete<br>Bit 15 = 1 - Reset (Note: Read back at 0b after you write a 1b)<br>Bits 3,6,7,8,9,10,13,14 - No function |
| | 405h | Dly_Hi | DCM | R | 4 | 0h | Delay Counter High Byte |
| | 406h | Dly_Lo | DCM | R | 16 | 1h | Delay Counter Low Byte |
| 7000h | 0h | Sync control | TCI | R/W | 16 | 0h | Sync control for all modules<br>Bit 0 - Sync Select 0b = CPU 1b = External<br>Bit 1 = Sync Source 0b = CPI 1b = PDI<br>Bit 2 = Sync on/off 0b = Of 1b = On<br>Bit 3 = Sync Mode Change |
| | 1h | SPD control | TCI | R/W | 16 | 0h | Bits 0,1 = SPD Sync Source 00b - NOP, 01b - CPU<br>10b - Delay, 11b - External<br>Bit 8 - CPU Dump Control 0b = Off, 01 b = On<br>Bit 10 - CPU Enabte Control 0b = Off, 01b = On<br>Bit 12 - Armed 0b = Off, 01b = On<br>Bit 15 - SPD timing reset 0b = Off, 01b = On<br>Bits 2,3,4,5,6,7,9,11,13,14 No function |
| | 2h | SPD Delay High | TCI | R/W | 4 | 0h | SPD delay counter high byte |
| | 3h | SPD Delay Low | TCI | R/W | 16 | 1h | SPD delay counter low byte |
| | 4h | SPD Enable High | TCI | R/W | 4 | 0h | SPD enable counter high byte |
| | 5h | SPD Enable Low | TCI | R/W | 16 | 1h | SPD enable counter low byte |
| | 6h | DOC control | TCI | R/W | 16 | 0h | Bits 0,1 = DOC Sync Source 00b - NOP, 01b - CPU<br>10b - Delay, 11b - External<br>Bit 8 - CPU Dump Control 0b = Off, 01b = On<br>Bit 10 - CPU Enable Control 0b = Off, 01b = On<br>Bit 12 - Armed 0b = Off, 01b = On<br>Bit 15 - SPD timing reset 0b = Off, 01b = On<br>Bits 2,3,4,5,6,7,9,11,13,14 No function |
| | 7h | DOC Delay High | TCI | R/W | 8 | 0h | DOC delay counter high byte |
| | 8h | DOC Delay Low | TCI | R/W | 16 | 1h | DOC delay counter low byte |
| | 9h | DOC Enable High | TCI | R/W | 8 | 0h | DOC enable counter high byte |
| | Ah | DOC Enable Low | TCI | R/W | 16 | 1h | DOC enable counter low byte |
| 8000h | 0h | Data Dec Rate Buf | DCF | R/W | 12 | 1h | buffered decimation rate for the output data |
| | 1h | Ram Dec Rate Buf | DCF | R/W | 12 | 1h | buffered decimation rate for the RAM data |
| | 2h | Bypass Mode Buf | DCF | R/W | 1 | 0h | buffered bypass mode or data path select<br>data path = 0h<br>bypass mode = 1h |
| | 3h | Output Data Format Buf | DCF | R/W | 2 | 0h | buffered data format select<br>data not rounded = 0h<br>round to 16 bits = 1h |
| | 4h | Ram Data Format Buf | DCF | R/W | 1 | 0h | buffered RAM data format select<br>data not rounded = 0h<br>round to 16 bits = 1h |
| | 5h | Scale Format Buf | DCF | R/W | 3 | 0h | buffered scale format for output data<br>output is input (round 16) data Bit 31, Bit 30:16 = 0h<br>output is input (round 16) data Bit 31, Bit 29:15 = 1h<br>output is input (round 16) data Bit 31, Bit 28:14 = 2h<br>output is input (round 16) data Bit 31, Bit 27:13 = 3h<br>output is input (round 16) data Bit 31, Bit 26:12 = 4h<br>output is input (round 16) data Bit 31, Bit 25:11 = 5h<br>output is input (round 16) data Bit 31, Bit 24:10 = 6h<br>output is input (round 16) data Bit 31, Bit 23:9 = 7h |
| 8000h | 6h | RAM Scale Format Buf | DCF | R/W | 3 | 0h | buffered scale format for RAM data<br>output is input (round 16) data Bit 31, Bit 30:16 = 0h<br>output is input (round 16) data Bit 31, Bit 29:15 = 1h<br>output is input (round 16) data Bit 31, Bit 28:14 = 2h<br>output is input (round 16) data Bit 31, Bit 27:13 = 3h<br>output is input (round 16) data Bit 31, Bit 26:12 = 4h<br>output is input (round 16) data Bit 31, Bit 25:11 = 5h<br>output is input (round 16) data Bit 31, Bit 24:10 = 6h<br>output is input (round 16) data Bit 31, Bit 23:9 = 7h |
| | 8h | Data Dec Rate | DCF | R | 12 | 1h | current decimation rate for the output data |
| | 9h | RAM Dec Rate | DCF | R | 12 | 1h | current decimation rate for the RAM data |
| | Ah | Bypass Mode | DCF | R | 1 | 0h | current bypass mode or data path select<br>data path = 0h<br>bypass mode = 1h |

TABLE 2-continued

Memory Map

| Base Addr | Offset Addr | Item | Module | Access | Data Size (bits) | Initial Value | Description |
|---|---|---|---|---|---|---|---|
| | | | | | | | 15-12 bits Base Address / 11 bit Growth / 10-0 bits Address Field |
| | Bh | Output Data Format | DCF | R | 2 | Dh | current data format select<br>data not rounded = 0h<br>round to 16 bits = 1h |
| | Ch | RAM Data Format | DCF | R | 1 | 0h | current RAM data format select<br>data not rounded = 0h<br>round to 16 bits = 1h |
| 8000h | Dh | Scale Format | DCF | R | 3 | 0h | current scale format for output data<br>output is input (round 16) data Bit 31, Bit 30:16 = 0h<br>output is input (round 16) data Bit 31, Bit 29:15 = 1h<br>output is input (round 16) data Bit 31, Bit 28:14 = 2h<br>output is input (round 16) data Bit 31, Bit 27:13 = 3h<br>output is input (round 16) data Bit 31, Bit 26:12 = 4h<br>output is input (round 16) data Bit 31, Bit 25:11 = 5h<br>output is input (round 16) data Bit 31, Bit 24:10 = 6h<br>output is input (round 16) data Bit 31, Bit 23:9 = 7h |
| | Eh | RAM Scale Format | DCF | R | 3 | 0h | current scale format for RAM data<br>output is input (round 16) data Bit 31, Bit 30:16 = 0h<br>output is input (round 16) data Bit 31, Bit 29:15 = 1h<br>output is input (round 16) data Bit 31, Bit 28:14 = 2h<br>output is input (round 16) data Bit 31, Bit 27:13 = 3h<br>output is input (round 16) data Bit 31, Bit 26:12 = 4h<br>output is input (round 16) data Bit 31, Bit 25:11 = 5h<br>output is input (round 16) data Bit 31, Bit 24:10 = 6h<br>output is input (round 16) data Bit 31, Bit 23:9 = 7h |
| 9000h | 00-07h | Buf Coefficients Mod 0 | FRB | R/W | 16 | 0h | Buffered Module 0 Tap 0-7 coefficients |
| | 08-0Fh | Buf Coefficients Mod 1 | FRB | R/W | 16 | 0h | Buffered Module 1 Tap 0-7 coefficienfs |
| | 10-17h | Buf Coefficients Mod 2 | FRB | R/W | 16 | 0h | Buffered Module 2 Tap 0-7 coefficients |
| | 18-1Fh | Buf Coefficients Mod 3 | FRB | R/W | 16 | 0h | Buffered Moduie 3 Tap 0-7 coefficients |
| | 20-27h | Buf Coefficients Mod 4 | FRB | R/W | 16 | 0h | Buffered Module 4 Tap 0-7 coefficients |
| | 28-2Fh | Buf Coefficients Mod 5 | FRB | R/W | 16 | 0h | Buffered Moduie 5 Tap 0-7 coefficients |
| | 30-37h | Buf Coefficients Mod 6 | FRB | R/W | 16 | 0h | Buffered Moduie 6 Tap 0-7 coefficients |
| | 38-3Fh | Buf Coefficienfs Mod 7 | FRB | R/W | 16 | 0h | Buffered Module 7 Tap 0-7 coefficients |
| | 40h | Buf Mode Register 1 | FRB | R/W | 16 | 0h | Buffered Mode 1 Control register<br>Data Bit 0 = 1; Enable ch2DataMuxEnRSig<br>Data Bit 1 = 1; Enable ch2ABDataMuxEnRSig<br>Data Bit 2 = 1; Enable ch2DataMuxEnRSig<br>Data Bit 3 = 1; Enable ch2ABDataMuxEnRSig<br>Data Bit 4 = 1; Enable ch1MultEnRSig<br>Data Bit 5 = 1; Enable ch2MultEnRSig<br>Data Bit 6 = 1; Enable ch1RndEnRSig<br>Data Bit 7 = 1; Enable ch2RndEnRSig<br>Data Bit 8 = 1: Enable ch1 MuxEnRSig<br>Data Bit 9 = 1; Enable ch1SumMux2EnRSig<br>Data Bit 10 = 1: Enable ch2MuxEnRSig<br>Data Bit 11 = 1: Enable ch2SumMux2EnRSig<br>Data Bit 12 = 1: EnablecrossCoupledEnRSig<br>Data Bit 13 = 1; Enable sumEnRSig<br>Data Bit 14 = 1: Enable dataEnSelRSig<br>Data Bit 15 = 1: Enable allTapMuxEnRSig<br>Data Bit 15 = 1: Enable allTapMuxEnRSig |
| | 80h | Buf. Mode Register 2 | FRB | R/W | 16 | 0h | Buffered Mode 2 Control register<br>Data Bit 0–14 No function<br>Data Bit 15 = 1; Enable firClr |
| 9000h | 100-107h | Coefficients Mod 0 | FRB | R | 16 | 0h | Module 0 Tap 0-7 coefficients |
| | 108-10Fh | Coefficients Mod 1 | FRB | R | 16 | 0h | Module 1 Tap 0-7 coefficients |
| | 110-117h | Coefficients Mod 2 | FRB | R | 16 | 0h | Module 2 Tap 0-7 coefficients |
| | 118-11Fh | Coefficients Mod 3 | FRB | R | 16 | 0h | Module 3 Tap 0-7 coefficients |
| | 120-127h | Coefficients Mod 4 | FRB | R | 16 | 0h | Module 4 Tap 0-7 coefficients |
| | 128-12Fh | Coefficients Mod 5 | FRB | R | 16 | 0h | Module 5 Tap 0-7 coefficients |
| | 130-137h | Coefficients Mod 6 | FRB | R | 16 | 0h | Module 6 Tap 0-7 coefficients |
| | 138-13Fh | Coefficients Mod 7 | FRB | R | 16 | 0h | Module 7 Tap 0-7 coefficients |

TABLE 2-continued

Memory Map

| | | | | 15-12 bits<br>Base Address | 11 bit<br>Growth | 10-0 bits<br>Address Field | | |
|---|---|---|---|---|---|---|---|---|
| Base<br>Addr | Offset<br>Addr | Item | | Module | Access | Data<br>Size<br>(bits) | Initial<br>Value | Description |
| | 140h | Mode Register 1 | | FRB | R | 16 | 0h | Mode 1 Control register<br>Data Bit 0; Read ch2DataMuxEnRsig<br>Data Bit 1; Read ch2ABDataMuxEnRSig<br>Data Bit 2; Read ch2DataMuxEnRSig<br>Data Bit 3; Read ch2ABDataMuxEnRsig<br>Data Bit 4; Read ch1MultEnRSig<br>Data Bit 5; Read ch2MultEnRSig<br>Data Bit 6; Read ch1RndEnRSig<br>Data Bit 7; Read ch2RndEnRSig<br>Data Bit 8; Read ch1MuxEnRSig<br>Data Bit 9; Read ch1SumMux2EnRSig<br>Data Bit 10; Read ch2MuxEnRSig<br>Data Bit 11; Read ch2SumMux2EnRSig<br>Data Bit 12; Read crossCoupledEnRSig<br>Data Bit 13; Read sumEnRSig<br>Dala Bit 14; Read dataEnSelRSig<br>Data Bit 15; Read allTapMuxEnRSig<br>Data Bit 15; allTapMuxEnRSig |
| | 180h | Mode Register 2 | | FRB | R | 16 | 0h | Mode 2 Control register<br>Data Bit 0–14; No function<br>Data Bit 15 = 1; Read firClr |

Accordingly,
What is claimed is:

1. An equalizer comprising:
first and second filters for filtering an in-phase component of a received signal in accordance with first and second sets of coefficients, respectively, said first and second filters being implemented in a general purpose filter;
third and fourth filters for filtering a quadrature component of said input signal in accordance with third and fourth sets of coefficients, respectively, said third and fourth filters being implemented in a general purpose filter;
first means for subtracting the outputs of said first and third filters to provide an equalized in-phase output signal;
second means for adding the outputs of said second and fourth filters to provide an equalized quadrature output signal; and
means for providing said coefficients.

2. The invention of claim 1 wherein said filters are finite impulse response filters.

3. An equalization method including the steps of:
filtering an in-phase component of a received signal with first and second filters in accordance with first and second sets of coefficients, respectively first and second filters for filtering an in-phase component of a received signal in accordance with first and second sets of coefficients, respectively, said first and second filters being implemented in a general purpose filter;
filtering a quadrature component of said input signal with third and fourth filters in accordance with third and fourth sets of coefficients, respectively, said third and fourth filters being implemented in a general purpose filter;
subtracting the outputs of said first and third filters to provide an equalized in-phase output signal; and
adding the outputs of said second and fourth filters to provide an equalized quadrature output signal.

4. The invention of claim 1 wherein said means for providing said coefficients is a microprocessor.

5. The invention of claim 4 wherein each finite impulse response filter includes a plurality of delay elements connected in series.

6. The invention of claim 5 wherein the coefficients are calculated in accordance with a mean square error algorithm.

7. The invention of claim 6 wherein the coefficients are the product of the correlation between inputs to said delay elements and a cross correlation between said inputs and a set of values representative of a desired response.

8. A digital receiver comprising:
an antenna for receiving a radio frequency signal;
a first signal processor disposed in a first channel for processing said received signal and providing a first baseline signal in response thereto;
a second signal processor disposed in a second channel for processing said received signal and providing a second baseline signal in response thereto;
first analog to digital converter means for processing said first baseline signal and providing a first digitized baseline signal in response thereto;
second analog to digital converter means for processing said second baseline signal and providing a second digitized baseline signal in response thereto; and
means for equalizing said first and second baseline signals, said means for equalizing including first and second equalizers disposed in said first and second channels respectively, each of said equalizers comprising:
first and second filters for filtering an in-phase component of a received signal in accordance with first and second sets of coefficients, respectively,
third and fourth filters for filtering a quadrature component of said input signal in accordance with third and fourth sets of coefficients, respectively,
first means for subtracting the outputs of said first and third filters to provide an equalized in-phase output signal, second means for adding the outputs of said second and fourth filters to provide an equalized quadrature output signal, and means for providing said coefficients; and means for combining the outputs of said first and second equalizers.

9. The invention of claim 8 wherein said filters are finite impulse response filters.

10. The invention of claim 8 wherein said filters are implemented in a general purpose filter.

11. The invention of claim 10 wherein said means for providing said coefficients is a microprocessor.

12. The invention of claim 11 wherein each finite impulse response filters includes a plurality of delay elements connected in series.

13. The invention of claim 12 wherein the coefficients are calculated in accordance with a mean square error algorithm.

14. The invention of claim 13 wherein the coefficients are the product of the correlation between inputs to said delay elements and a cross correlation between said inputs and a set of values representative of a desired response.

* * * * *